(12) United States Patent
Shimomura et al.

(10) Patent No.: US 7,208,395 B2
(45) Date of Patent: Apr. 24, 2007

(54) LASER IRRADIATION APPARATUS, LASER IRRADIATION METHOD, AND METHOD FOR MANUFACTURING SEMICONDUCTOR DEVICE

(75) Inventors: Akihisa Shimomura, Atsugi (JP); Hironobu Shoji, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 191 days.

(21) Appl. No.: 10/871,376

(22) Filed: Jun. 21, 2004

(65) Prior Publication Data

US 2004/0266079 A1 Dec. 30, 2004

(30) Foreign Application Priority Data

Jun. 26, 2003 (JP) .............................. 2003-182650

(51) Int. Cl.
*H01L 21/268* (2006.01)
(52) U.S. Cl. ............................... 438/487; 257/E21.134
(58) Field of Classification Search ................ 438/293, 438/486, 487
See application file for complete search history.

(56) References Cited

U.S. PATENT DOCUMENTS

| | | | |
|---|---|---|---|
| 5,643,801 A | 7/1997 | Ishihara et al. | |
| 5,854,803 A | 12/1998 | Yamazaki et al. | |
| 5,897,799 A | 4/1999 | Yamazaki et al. | |
| 5,900,980 A | 5/1999 | Yamazaki et al. | |
| 5,923,962 A | 7/1999 | Ohtani et al. | |
| 5,953,597 A | 9/1999 | Kusumoto et al. | |
| 5,959,779 A | 9/1999 | Yamazaki et al. | |
| 6,002,523 A | 12/1999 | Tanaka | |
| 6,038,075 A | 3/2000 | Yamazaki et al. | |
| 6,210,996 B1 | 4/2001 | Yamazaki et al. | |
| 6,468,842 B2 | 10/2002 | Yamazaki et al. | |
| 6,544,825 B1 | 4/2003 | Yamazaki | |
| 6,548,370 B1 | 4/2003 | Kasahara et al. | |
| 6,573,161 B1 * | 6/2003 | Miyasaka et al. | ........... 438/487 |
| 6,693,257 B1 | 2/2004 | Tanaka | |
| 2002/0031876 A1 | 3/2002 | Hara et al. | |
| 2003/0086182 A1 * | 5/2003 | Tanaka et al. | ............... 359/719 |
| 2003/0148565 A1 * | 8/2003 | Yamanaka | ................... 438/200 |
| 2004/0198028 A1 | 10/2004 | Tanaka et al. | |

FOREIGN PATENT DOCUMENTS

| | | | |
|---|---|---|---|
| JP | 04-124813 | | 4/1992 |
| JP | 07-187890 | | 7/1995 |
| JP | 2000012484 A | * | 1/2000 |
| JP | 2001-156018 | | 6/2001 |

\* cited by examiner

*Primary Examiner*—Carl Whitehead, Jr.
*Assistant Examiner*—Jennifer M Dolan
(74) *Attorney, Agent, or Firm*—Eric J. Robinson; Robinson Intellectual Property Law Office, P.C.

(57) ABSTRACT

When the laser light having the harmonic is used for crystallizing the semiconductor film, there is a problem that the energy conversion efficiency from the fundamental wave to the harmonic is low. And since the laser light converted into the harmonic has lower energy than the fundamental wave, it is difficult to enhance the throughput by enlarging the area of the beam spot. The present invention provides a laser irradiation apparatus emitting the fundamental wave simultaneously with the wavelength not longer than that of the fundamental wave, typically the harmonic converted from the fundamental wave, wherein the laser light emitted from one resonator having the fundamental wave and the wavelength not longer than that of the fundamental wave are irradiated without being separated.

30 Claims, 7 Drawing Sheets

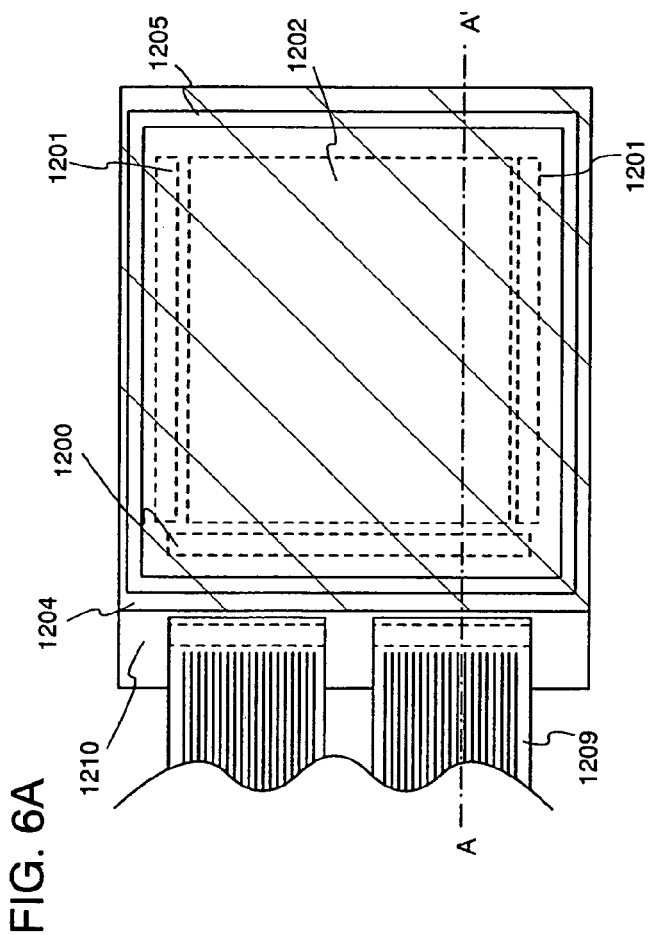
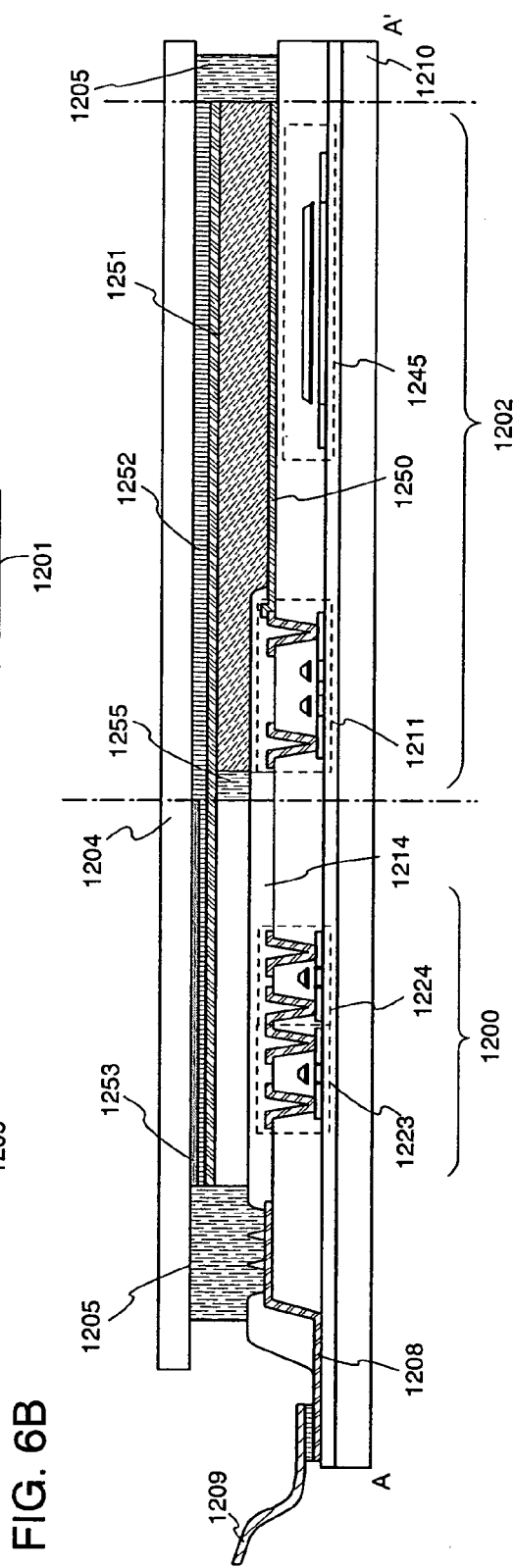
FIG. 6A
FIG. 6B

LASER IRRADIATION APPARATUS, LASER IRRADIATION METHOD, AND METHOD FOR MANUFACTURING SEMICONDUCTOR DEVICE

BACKGROUND OF THE INVENTION

1. Field of the Invention

The present invention relates to a laser irradiation apparatus used for crystallizing a semiconductor film. In addition, the present invention relates to a method for manufacturing a semiconductor device including a step for crystallizing the semiconductor film using the laser irradiation apparatus.

2. Related Art

A thin film transistor (TFT) using a crystalline semiconductor film has higher mobility by double digits or more than TFT using an amorphous semiconductor film and has an advantage that TFT can be formed on an inexpensive glass substrate by using a laser annealing method.

Lasers are classified broadly into two types of a pulsed laser and a continuous wave laser according to its oscillation system. The output energy of the laser light per unit time, which is peak power, of the pulsed laser is higher by three to six digits than that of the continuous wave laser. Therefore, when the beam spot (the region irradiated with the laser light in fact on the surface of the processing object) is shaped into a rectangle having a length of several cm on a side or into a line having a length of 100 mm or more through an optical system, it is possible to irradiate the semiconductor film efficiently and to enhance the throughput.

Incidentally, the absorption coefficient of the laser light to the semiconductor film depends on the material of the semiconductor film. When a silicon film having a thickness from several tens to several hundreds nm is crystallized with the use of a YAG laser or a $YVO_4$ laser, the second harmonic having a shorter wavelength than the fundamental wave is higher in the absorption coefficient, and therefore the crystallization can be performed efficiently. In addition, in order to emit the harmonic, the fundamental wave is oscillated first, and then it is converted into the harmonic through a harmonic generator or the like. And the fundamental wave and the harmonic are separated as needed (refer to the patent document 1).

[Patent Document 1]

Japanese Patent Unexamined Publication No. 2001-156018

In addition, a solid-state laser has been utilized not only in the laser crystallizing process, but also in the fields of physics and chemistry (for example, a light source of a spectroscopic measuring apparatus), an optical fiber communication, a metal working application (laser welding), and so on.

In the fields of the physics and chemistry and the optical fiber communication, since it is premised to use the laser light at a single wavelength, it is natural to separate the fundamental wave and the harmonic and to use one of them. In the case of the metal working, since the metal absorbs the fundamental wave, the fundamental wave may be used as it is and it is unnecessary to convert it into the harmonic. For these reasons, the solid-state laser available in the market emits the fundamental wave or the harmonic after separating the fundamental wave and the harmonic.

Even in the field of the laser crystallizing apparatus, when the solid-state laser is used in the laser crystallization, it has been common to separate the harmonic which is absorbed in the semiconductor film having solid-phase silicon and to use it singularly, because the fundamental wave is not absorbed in the semiconductor film having solid-phase silicon. In other words, since the semiconductor film does not absorb the emission wavelength (fundamental wave) of the solid-state laser, the second harmonic, the third harmonic, or the higher harmonic, which has a wavelength in the range of the visible light region to the ultraviolet light region, is used in the case of using the solid-state laser in the laser annealing.

However, it is a problem that the energy conversion efficiency for converting the fundamental wave into the harmonic is low. For example, in the case of a Nd: YAG laser, the conversion efficiency from the fundamental wave (wavelength: 1064 nm) to the second harmonic (wavelength: 532 nm) is approximately 50%.

In addition, since the nonlinear optical element for converting into the harmonic has extremely low resistance against the laser light, it is difficult to raise the output of the fundamental wave. For example, a continuous wave YAG laser can output the fundamental wave with an energy as high as 10 kW, while it can output the second harmonic with an energy as low as 10 W in consideration of the resistance of the nonlinear optical element.

Therefore, in order to obtain the necessary energy density for crystallizing the semiconductor film, the area of the beam spot must be narrowed to the size of $10^{-3}$ mm$^2$, which is inferior in terms of the throughput. Since the laser light converted into the harmonic has lower energy than the fundamental wave, it is difficult to enhance the throughput by enlarging the area of the beam spot. In particular, since the continuous wave laser has lower output than the pulsed laser per unit time, this tendency is remarkable.

Consequently, it is an object of the present invention to suggest a novel laser annealing method and to provide a method for crystallizing the semiconductor film efficiently. Moreover, it is an object of the present invention to provide a method for manufacturing a semiconductor device having a crystalline semiconductor film formed by the novel laser annealing method.

In view of the above problems, the present inventors found a method for irradiating the laser light to the irradiated object (also referred to as the processing object) without separating the fundamental wave and the harmonic. In other words, the present invention provides a laser irradiation apparatus (laser annealing apparatus) for irradiating the fundamental wave and the wavelength not longer than that of the fundamental wave to the irradiated object wherein the laser light emitted from one resonator (oscillator) having both the fundamental wave and the wavelength not longer than that of the fundamental wave is irradiated simultaneously to the same irradiated surface. In particular, in the present invention, the fundamental wave and the wavelength not longer than that of the fundamental wave are irradiated to the irradiated object without being separated.

As thus described, it is possible to perform the laser irradiation (the laser annealing) efficiently by irradiating the harmonic having low energy and the fundamental wave to the irradiated object without separating them. In other words, since they are irradiated without being separated, the fundamental wave can be irradiated so as to assist the harmonic having low energy. The fundamental wave is preferable in particular because the fundamental wave is easy to be absorbed in the semiconductor film having melted silicon. In other words, the semiconductor film having the melted silicon is high in the absorption coefficient of the fundamental wave compared with the crystalline semiconductor film having solid silicon.

In order to carry out the present invention, the laser irradiation apparatus comprises a laser resonator outputting the fundamental wave and the wavelength not longer than that of the fundamental wave, means for moving the irradiated object and the laser light from the laser resonator relatively, and means for shaping the laser light into linear. Moreover, the means for shaping the laser light into linear has means for converging (focusing) the laser light having the fundamental wave and the wavelength not longer than that of the fundamental wave. In the present invention, the laser light may be generated either in a pulse oscillation or in a continuous wave oscillation.

It is noted that the term "linear" herein used does not mean a line strictly but means a rectangle (or an oblong) having a large aspect ratio. For example, the rectangular shape having an aspect ratio of 2 or more (preferably in the range of 10 to 10000) is referred to as linear though the linear is still included in the rectangular.

A laser medium included in the laser resonator of the present invention is a solid selected from the group consisting of YAG, YLF, $YVO_4$, $Y_2O_3$, glass, sapphire, forsterite, LuAg, and $LuLiF_4$, each of which is doped with an ion such as Nd, Yb, Ti, Cr, Ho, or Er. The laser having such a solid as the laser medium is referred to as the solid-state laser.

The wavelength not longer than that of the fundamental wave is for example the harmonic of the fundamental wave, and there are the second harmonic, the third harmonic, the fourth harmonic, and so on. Since the main emission wavelength of the solid-state laser is in the infrared region, the second harmonic is mainly in the visible light region.

As the typical solid-state laser, there are a Nd: YAG laser: 532 nm, a Nd: $YVO_4$ laser: 532 nm, a Nd: YLF laser: 527 nm (or 524 nm), a Ti: Sapphire laser: 345 to 550 nm (the wavelength is variable), and an alexandrite laser: 350 to 410 nm (the wavelength is variable).

In order to convert the fundamental wave into the harmonic, the non-linear optical element such as SHG (Second Harmonic Generation) or THG (Third Harmonic Generation) is used. For example, the crystal whose nonlinear optical constant is relatively large such as KTP ($KTiOPO_4$), BBO ($\beta$-$BaB_2O_4$), LBO ($LiB_3O_5$), CLBO ($CsLiB_6O_{10}$), GdYCOB ($GdYCa_4O(BO_3)_3$), KDP ($KD_2PO_4$), $KB_5$, $LiNbO_3$, $Ba_2NaNb_5O_{15}$, or the like is used as the SHG. Particularly, the crystal such as LBO, BBO, KDP, KTP, $KB_5$, CLBO, or the like can increase conversion efficiency from the fundamental wave into the harmonic.

In the present invention, the laser light may be irradiated obliquely to the surface of the processing object. On this occasion, the laser light shaped into linear is irradiated in such a way that the incidence angle $\phi$ of the laser light satisfies the inequality $\phi \geq \arctan(W/2d)$ when it is assumed that "W" is the length of the major axis or the minor axis of the linear laser light and that "d" is the thickness of the substrate on which the processing object is deposited and which is translucent to the laser light. When the laser light is thus incident obliquely, it is possible to prevent the interference of the laser light in the processing object and to perform more uniform laser annealing.

The laser irradiation apparatus of the present invention needs only one resonator because the fundamental wave and the harmonic from one resonator are irradiated without being separated. Therefore, the running cost of the resonator can be lowered. In addition, it is easy to adjust the optical system compared with the case in which the laser light having the fundamental wave and the laser light having the harmonic are emitted from the respective resonators and they are combined at the irradiated surface. And since the fundamental wave and the harmonic are shaped into linear through the same optical system, the optical system can be simplified. Of course, the lens and the like for separating the fundamental wave and the harmonic are no longer necessary.

It is considered that when the laser light having the fundamental wave and the harmonic is used to anneal the semiconductor film, the laser light of the fundamental wave is easily absorbed in the semiconductor film because the harmonic can melt the semiconductor film and thereby drastically increasing the absorption coefficient of the fundamental wave to the semiconductor film.

Therefore, it is possible to enlarge the region to be annealed, which is the region having superior crystallinity, by irradiating the laser light without separating the harmonic and the fundamental wave. This can increase the throughput and provide a crystalline semiconductor film of high quality.

With the laser annealing performed as described above, it is possible to manufacture a sophisticated thin film transistor and a semiconductor device having it in the high-throughput process at low cost.

BRIEF DESCRIPTION OF THE DRAWINGS

In the accompanying drawings:

FIGS. 6A and 6B are drawings which illustrate a liquid crystal display device manufactured by performing the laser irradiation according to the present invention.

DETAILED DESCRIPTION OF THE INVENTION

Figure 1:
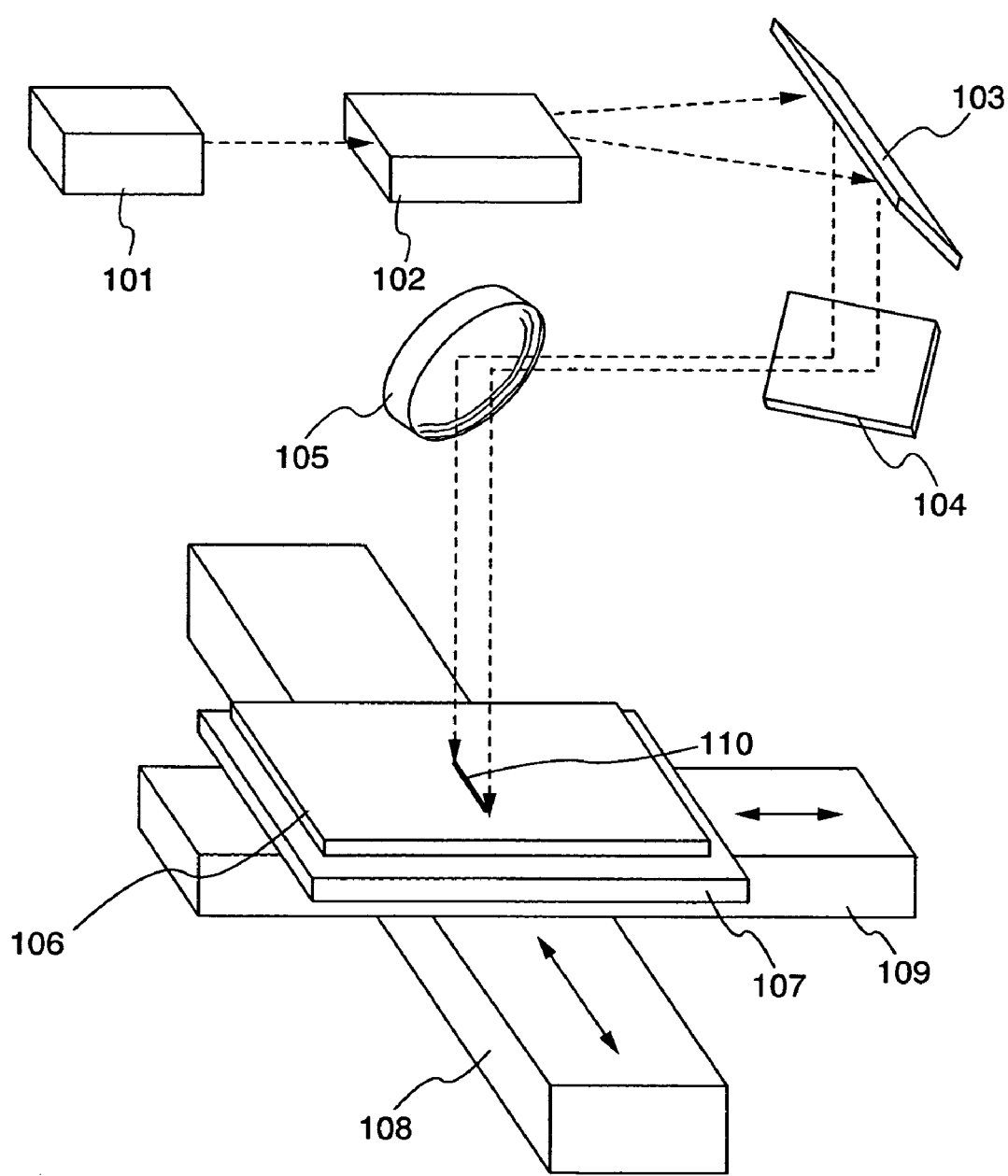
FIG. 1 is a drawing which illustrates the laser irradiation apparatus of the present invention.

Embodiment modes of the present invention are hereinafter explained based on drawings. However, since the present invention can be embodied in many different modes, it is easily understood by those skilled in the art that the modes and the details of the present invention can be changed and modified in various ways unless such changes and modifications depart from the scope and content of the present invention. Thus, the present invention is not limited to the description of the embodiment modes. In addition, the same reference numeral is given to the same part or the part having the similar function throughout the drawings for explaining the embodiment modes. And the explanation to such a part is not repeated.

[Embodiment Mode 1]

The present embodiment mode explains the laser irradiation apparatus specifically.

FIG. 1 shows the laser annealing apparatus comprising; a laser resonator 101 having an excitation source, a laser medium, and a nonlinear optical element; an optical system 102 including a cylindrical lens array; a first reflector 103; a second reflector 104; a condenser 105 for focusing both of the fundamental wave and the second harmonic; a stage 107 for fixing an irradiated object 106; and a uniaxial robot 108 for X axis and a uniaxial robot 109 for Y axis, which are the means for moving the stage.

It is noted that although this embodiment mode illustrates the case of an internal conversion type in which the laser resonator incorporates the nonlinear optical element, an external conversion type may be also employed in which the nonlinear optical element is provided outside the laser resonator. The optical system 102 includes a homogenizer consisting of a cylindrical lens and the like. The first and the second reflectors and the condenser 105 may be arranged in the predetermined position as needed.

Since it is necessary for the condenser 105 to focus both of the fundamental wave and the second harmonic, a reflector having a curved surface such as a concave mirror can be used. In case of using the concave mirror or the like, it can reflect all the laser light at any wavelengths with no chromatic aberration and can focus the laser light on the irradiated surface. Moreover, it can reduce cost. Further, an achromatic lens which can compensate the chromatic aberration may be also used. It is noted that the laser light may be made incident from the optical system 102 directly into the condenser 105 to irradiate the linear laser to the irradiated object in FIG. 1.

In other words, the optical system 102 and the condenser 105 correspond to one means for shaping the laser light into linear laser on the irradiated surface. It is noted that the linear laser can be formed by setting a plurality of cylindrical lenses or by combining with a convex lens or a concave lens.

The laser resonator 101 emits pulsed laser light having a power from 200 to 300 W such as Nd: YAG laser light without separating the fundamental wave having an emission wavelength of 1064 nm and the second harmonic having an emission wavelength of 532 nm. It is noted that, in the strict sense, the laser light having both wavelengths can be emitted in such a way that the fundamental wave is emitted from the laser resonator and then the fundamental wave is converted into the harmonic. The fundamental wave and the second harmonic have a frequency of 1 kHz and a pulse width of approximately 120 ns.

It is preferable that the laser light is $TEM_{00}$ mode (single mode) obtained from a stable resonator. In the case of $TEM_{00}$ mode, the laser light has Gaussian intensity distribution and is superior in the light convergence. Therefore, it becomes easy to transform the beam spot.

The optical system 102 transforms the beam spot of the laser light for the purpose of homogenizing the energy distribution thereof on the surface (an irradiated surface) of the irradiated object 106. The traveling direction of the laser light is changed as needed by reflecting it on the first reflector 103 and the second reflector 104. And, the laser light is irradiated to the irradiated object 106 through the condenser 105. As the first and the second reflectors, a mirror can be used.

In particular, it is possible to converge the laser light so as to be a linear laser 110 on the irradiated surface by making the laser light transmit through the condenser 105. The shape of the linear laser on the irradiated surface, which is the beam spot, has a length of 100 mm and a width of 20 µm for example. Such a linear laser can process a large area. As a result, the throughput of the laser annealing process can be improved.

In the present embodiment mode, the substrate with a semiconductor film formed thereover is set as the processing object 106 in parallel with the horizontal surface. The semiconductor film is formed over a glass substrate having a thickness of 0.7 mm. A suction mechanism is provided in the stage 107 in order to fix the substrate so that the substrate does not fall during the laser irradiation. The suction mechanism can fix the substrate so as to decrease the deflection of the substrate. Moreover, the laser processing can be performed even when the substrate is fixed so as to be bent in a predetermined shape.

The stage 107 can move in XY directions on the surface parallel to the irradiated surface by the uniaxial robot 108 for X axis and the uniaxial robot 109 for Y axis. In other words, the uniaxial robot 108 for X axis and the uniaxial robot 109 for Y axis correspond to means for moving the irradiated object 106 and the laser light relatively.

The laser annealing is performed at a feed pitch from 1 to 30 µm per a pulse using such a laser irradiation apparatus. In the present embodiment mode, the laser annealing is performed at a feed pitch of 5 µm.

Next, a scanning route of the beam spot 110 on the surface of the processing object 106 is explained. In the case of irradiating the laser light to the whole surface of the semiconductor film, which is the processing object 106, after scanning the beam spot 110 in one direction using the Y-axis robot 109, the beam spot 110 is slid using the X-axis robot 108 in the direction perpendicular to the direction scanned by the Y-axis robot 109. By repeating the scanning with the use of the Y-axis robot 109 and the X-axis robot 108 sequentially, the laser light can be irradiated to the whole surface of the processing object 106.

The region where the crystal grain grown in the scanning direction is formed by the irradiation of the laser light is very superior in the crystallinity. Therefore, when this region is used as the channel forming region of TFT, considerably high electrical mobility and on-current can be expected. However, when there is the region in the semiconductor film not requiring such high crystallinity, the laser light may not be irradiated to such a region. Alternatively, the laser light may be irradiated under the condition in which the high crystallinity is not obtained for example by increasing the scanning speed. Thus, the throughput can be enhanced further by increasing the scanning speed partially.

It is noted that as the method for scanning the laser light, there are an irradiation system moving method in which a substrate as a processing object is fixed while an irradiated position of the laser light is moved; an object moving method in which the irradiated position of the laser light is fixed while the substrate is moved; and a method in which these two methods are combined. The object moving method is appropriate in the laser irradiation apparatus of the present embodiment mode because the structure of the optical system can be simplified the most. However, the laser irradiation apparatus is not limited to this, and it is not impossible to employ any one of the methods by devising the optical system. In any case, it is premised that the moving direction of each laser light, which is the beam spot, relative to the semiconductor film can be controlled.

As described above, since the fundamental wave and the harmonic from one resonator are irradiated without being separated, only one resonator is needed. Thus, the running cost of the resonator can be lowered. In addition, since it is unnecessary to oscillate the laser light having the fundamental wave and the laser light having the harmonic from the respective resonators and to combine them on the irradiated surface, the optical system is easily adjusted.

Moreover, since the fundamental wave and the harmonic are shaped into linear through the same optical system, the optical system can be simplified.

Moreover, in the present embodiment mode, a crystalline semiconductor film of high quality can be obtained by performing the laser annealing in such a way that the laser light having the fundamental wave and the laser light having a wavelength not longer than that of the visible light are combined. As a result of the above, a sophisticated thin film transistor and a semiconductor device having it can be manufactured in the high-throughput process at low cost.

As the present embodiment mode, the solid-state laser having a solid laser medium is maintenance-free and the output is stable. In particular, it is considered that the pulsed solid-state laser is superior in mass production because higher oscillation frequency than that of a pulsed excimer laser is possible. However, the present invention is not limited to the pulsed laser shown in the present embodiment mode, and a continuous wave laser may be also used.

It is noted that the optical system in the laser irradiation apparatus is not limited to the structure shown in the present embodiment mode.

[Embodiment Mode 2]

The present embodiment mode explains the case in which a continuous wave laser is used to irradiate the laser light obliquely to the surface of the processing object.

Figure 2:
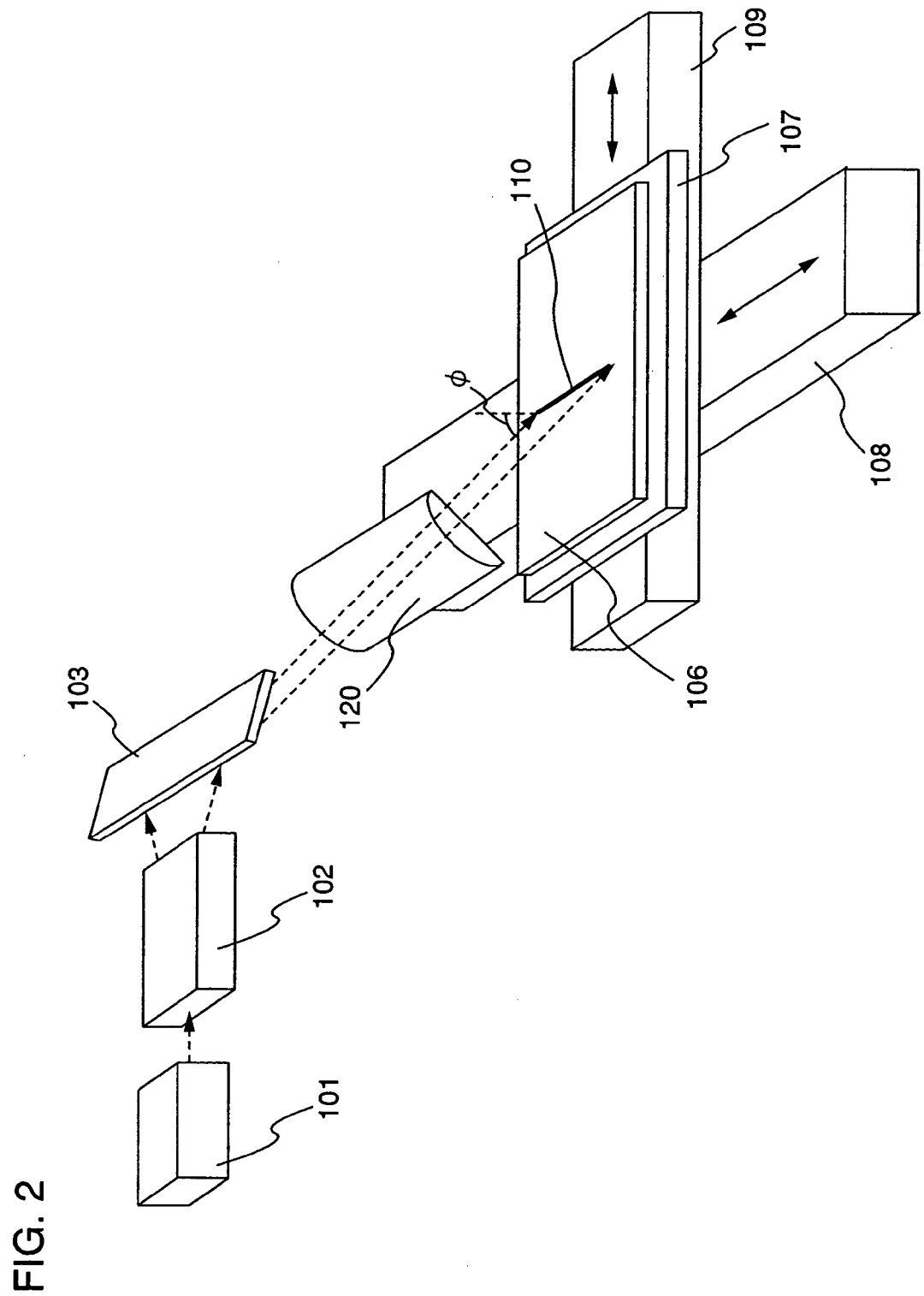
FIG. 2 is a drawing which illustrates the laser irradiation apparatus of the present invention.

FIG. 2 shows a laser annealing apparatus comprising a laser resonator 101 having an excitation source, a laser medium, and a nonlinear optical element; an optical system 102 including a cylindrical lens array or a diffractive optical element; a first reflector 103; a condenser 120; a stage 107 for fixing an irradiated object 106; and a uniaxial robot 108 for X-axis and a uniaxial robot 109 for Y-axis, which are means for moving the stage 107.

In FIG. 2, in order to irradiate the laser light obliquely to the surface of the processing object, the incidence angle of the laser is tilted to the processing object. Alternatively, a uniaxial robot for φ axis may be provided in order to tilt the stage 107.

It is noted that although this embodiment mode explains the case of an internal conversion type in which the laser resonator incorporates the nonlinear optical element, an external conversion type may be also employed in which the nonlinear optical element is provided outside the laser resonator. The optical system 102 may include a homogenizer consisting of a cylindrical lens, a diffractive optical element, or the like to divide the laser light.

An achromatic lens with no chromatic aberration can be used as the condenser 120 because it is necessary for the condenser 120 to converge both the fundamental wave and the second harmonic. In addition, as shown in the embodiment mode 1, a reflector having a curved surface such as a concave mirror may be used.

The laser resonator 101 emits continuous wave laser light having a power from 200 to 300 W such as Nd: YAG laser light without separating the fundamental wave having an emission wavelength of 1064 nm and the second harmonic having an emission wavelength of 532 nm. It is noted that, in the strict sense, the laser light having both wavelengths can be emitted in such a way that the fundamental wave is emitted from the laser resonator and then the fundamental wave is converted into the harmonic.

In such a continuous wave laser irradiation method, it is appropriate that the beam spot 110 is scanned at a scanning speed from several to several hundreds cm/s. The scanning speed is set to 50 cm/s in the present embodiment mode.

Thus, the present invention may use a continuous wave laser. And, the laser irradiation can be performed efficiently by irradiating the laser light without separating the fundamental wave and the harmonic having low energy. Therefore, the region to be annealed, which is the region having superior crystallinity, can be enlarged. Thus, the throughput can be expected to increase.

In addition, in the present embodiment mode, the laser light is irradiated to the irradiated object 106 at an incidence angle φ. On this occasion, the laser light shaped into linear is irradiated in such a way that the incidence angle φ of the laser light satisfies the inequality $\phi \geq \arctan(W/2d)$ when it is assumed that "W" is the length of the major axis or the minor axis of the linear laser light 110 and that "d" is the thickness of the substrate which is translucent to the laser light and on which the irradiated object is provided. It is noted that the reflector 103 and the condenser 120 correspond to one means for controlling so that the incidence angle φ of the laser light satisfies the inequality of $\phi \geq \arctan(W/2d)$. For example, a cylindrical lens can be employed as the condenser.

When the laser light is incident at this incidence angle φ, uniform irradiation of the laser light can be performed without the interference between the reflected light from the surface of the substrate and the reflected light from the rear surface of the substrate. The above-mentioned theory is given assuming that the refractive index of the substrate is 1. In fact, the substrate has a refractive index of approximately 1.5, and a larger value than the angle calculated in accordance with the above theory is obtained when the value around 1.5 is taken into account. However, since the laser light on the surface to be irradiated has energy attenuated at opposite ends, the interference has a small influence on opposite ends and the value calculated in accordance with the inequality is enough to obtain the advantageous effect of attenuating the interference. The laser having an extremely short coherent length does not have to satisfy the inequality.

The inequality with respect to φ is applied only to the substrate having translucency to the laser light. It is noted that the glass substrate is translucent to the fundamental wave of a YAG laser having a wavelength of approximately 1 μm and to the second harmonic.

The object moving method in which the irradiated position of the laser light is fixed while the substrate is moved is the most preferable in the laser irradiation apparatus of the present embodiment mode because the optical system can be simplified the most. However, as well as in the embodiment mode 1, it is not impossible to employ the irradiation system moving method or to combine the object moving method and the irradiation system moving method by devising the optical system. In any case, it is premised that the moving direction of each beam spot relative to the semiconductor film can be controlled.

Since the fundamental wave and the harmonic from one resonator are irradiated without being separated, only one resonator is needed in the laser irradiation apparatus of the present embodiment mode. Therefore, the running cost of the resonator can be lowered. In addition, since it is unnecessary to oscillate the laser light having the fundamental wave and the laser light having the harmonic from the respective resonators and to combine them on the irradiated surface, the optical system is easily adjusted. And since the fundamental wave and the harmonic are shaped into linear through the same optical system, the optical system can be simplified.

This makes it possible to manufacture a sophisticated thin film transistor and a semiconductor device having it in the high-throughput process at low cost.

It is noted that the optical system in the laser irradiation apparatus is not limited to the structure shown in the present embodiment mode. In addition, although the present embodiment mode explained the case of using the continuous wave laser, a pulsed laser may be also used.

[Embodiment Mode 3]

The present embodiment mode explains the whole system of the laser irradiation apparatus.

Figure 3:
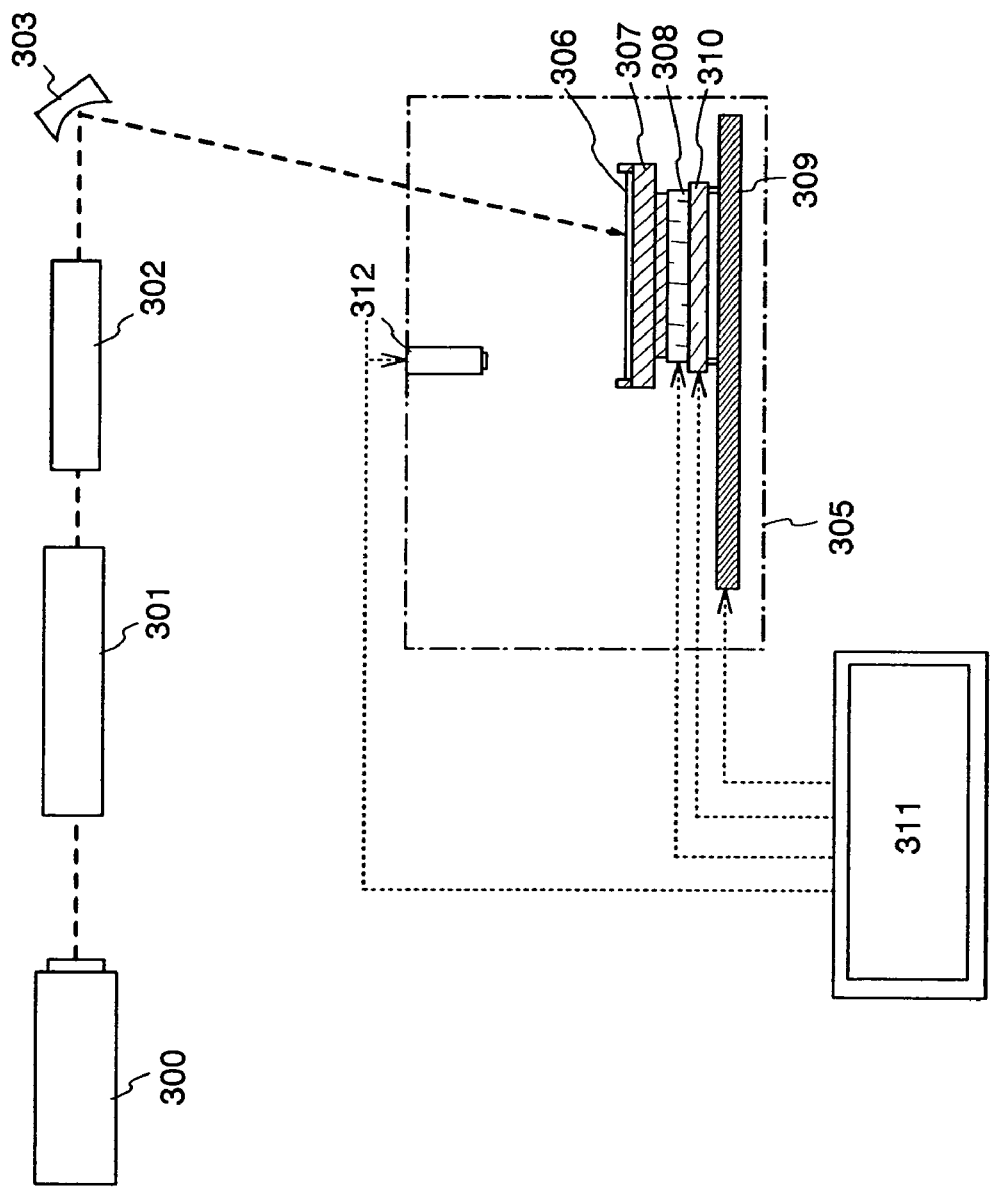
FIG. 3 is a drawing which illustrates the laser irradiation apparatus of the present invention.

FIG. 3 shows the whole system of the laser irradiation apparatus. In the present embodiment mode, the laser light having the fundamental wave and the wavelength not longer than that of the fundamental wave is oscillated from a laser resonator 300.

The laser light oscillated from the laser resonator 300 has the fundamental wave and the second harmonic converted through a nonlinear optical element and it is incident into a beam expander 301. The beam expander 301 suppresses the divergence of the incident laser light and adjusts the size of the sectional shape of the beam.

The laser light emitted from the beam expander 301 is transformed through the cylindrical lens 302 so that the sectional shape of the beam may become rectangular, elliptical, or linear. And then the laser light is reflected by the concave mirror 303 corresponding to the condenser and it is converged so as to be linear. After that, it is irradiated to the processing object 306 in a laser irradiation chamber 305.

As thus described, it is possible to assist the harmonic having low energy and to form the irradiated object, for example a semiconductor film, having high crystallinity efficiently by employing the laser light having the fundamental wave and the harmonic. In addition, the irradiated surface can be enlarged by irradiating the fundamental wave and the harmonic.

In the laser irradiation chamber 305, the processing object 306 is set on the stage 307 whose position is controlled by three uniaxial robots 308, 309, and 310 functioning as the means for controlling the positions. Specifically, the uniaxial robot 308 for φ axis can rotate the stage 307 in the horizontal surface. In addition, the uniaxial robot 309 for X-axis can move the stage 307 in X-axis direction. In addition, the uniaxial robot 310 for Y-axis can move the stage 307 in Y-axis direction. Furthermore, the stage 307 itself may be tilted. It is a central processing device 311 that controls the operation of the means for controlling the position.

An aggregation of the crystal grains extending long in the scanning direction can be formed by scanning the processing object in X direction while irradiating the linear beam spot extended long in Y-axis direction. In the case of the continuous wave laser, the scanning speed is preferable in the range of 10 to 2000 mm/s, more preferably in the range of 100 to 1000 mm/s for example. The beam width is preferable in the range of several hundreds μm to 1 mm. This can form the crystal grains of the crystal grown in the region having a width of 100 mm in the direction perpendicular to the scanning direction. On the other hand, in the case of the pulsed laser, the feed pitch of the substrate per a pulse is preferably set in the range of 1 to 30 μm.

In addition, as the present embodiment mode, a monitor 312 with the use of a photo detector such as CCD may be provided in order to know the exact position of the processing object 306.

The laser processing based on the accurate position controlling can be performed by using such a system of the laser irradiation apparatus. Moreover, it is possible to fix the stage so that the processing object is set horizontally or on a tilt and to perform the laser irradiation vertically or obliquely. Furthermore, the stage itself may be tilted.

[Embodiment Mode 4]

The present embodiment mode explains a laser irradiation method and a method for manufacturing a semiconductor device.

Figure 4A:
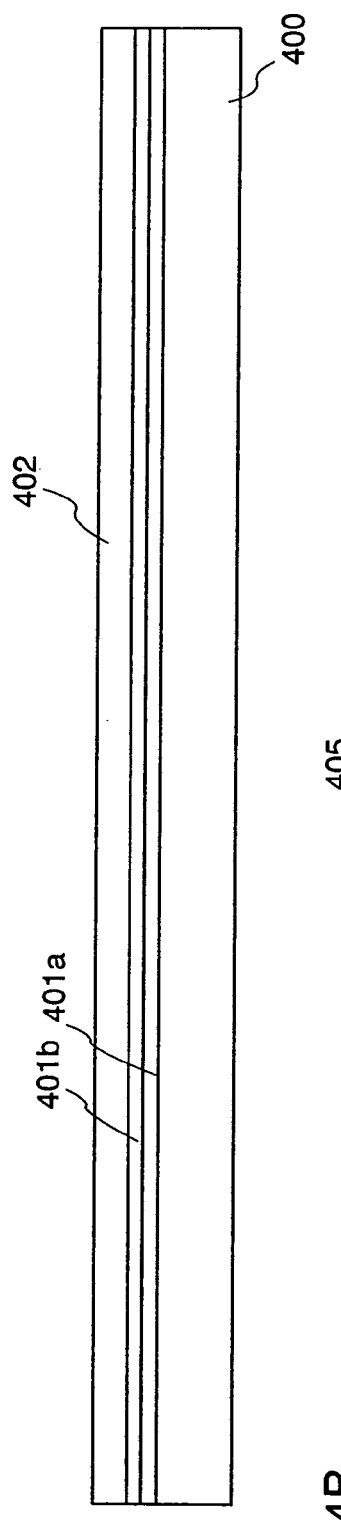
FIGS. 4A to 4C are drawings which illustrate a method for manufacturing TFT by performing the laser irradiation according to the present invention.

Initially, as shown in FIG. 4A, base films 401a and 401b are formed on a substrate 400 having an insulating surface. A glass substrate such as a barium borosilicate glass or an alumino borosilicate glass, a quartz substrate, or an SUS substrate can be used as the substrate 400. In addition, although a substrate made of flexible synthetic resin such as acryl or plastic typified by PET, PES, PEN, or the like tends to be inferior to the above substrates in point of the resistance against the heat, the substrate made of flexible synthetic resin can be used when it can resist the heat generated in the manufacturing process.

The base films 401a and 401b are provided in order to prevent that alkaline-earth metal or alkali metal such as Na included in the substrate 400 diffuses into the semiconductor film to have an adverse effect on the characteristic of the semiconductor element. Therefore, each base film is formed of an insulating film such as silicon oxide, silicon nitride, or silicon nitride oxide which can suppress the diffusion of the alkaline-earth metal and alkali metal into the semiconductor film. In the present embodiment mode, a silicon oxynitride film is formed in a thickness from 10 to 200 nm (preferably from 50 to 100 nm) and a silicon oxynitride film is formed thereon in a thickness from 50 to 200 nm (preferably from 100 to 150 nm) by plasma-CVD. It is noted that the base film 401 may be single-layered.

In the case of using the substrate including the alkali metal or the alkaline-earth metal in any way such as the glass substrate, the SUS substrate, or the plastic substrate, it is effective to provide the base film in terms of preventing the diffusion of the impurity. When the diffusion of the impurity does not lead to any significant problems, for example when the quartz substrate is used, the base film is not always necessary to be provided.

An amorphous semiconductor film 402 is formed on the base film 401b in a thickness from 25 to 100 nm (preferably from 30 to 60 nm). In addition, not only silicon but also silicon germanium can be used as the amorphous semiconductor. When silicon germanium is used, it is preferable that the concentration of germanium is in the range of 0.01 to 4.5 atomic %.

Figure 4B:
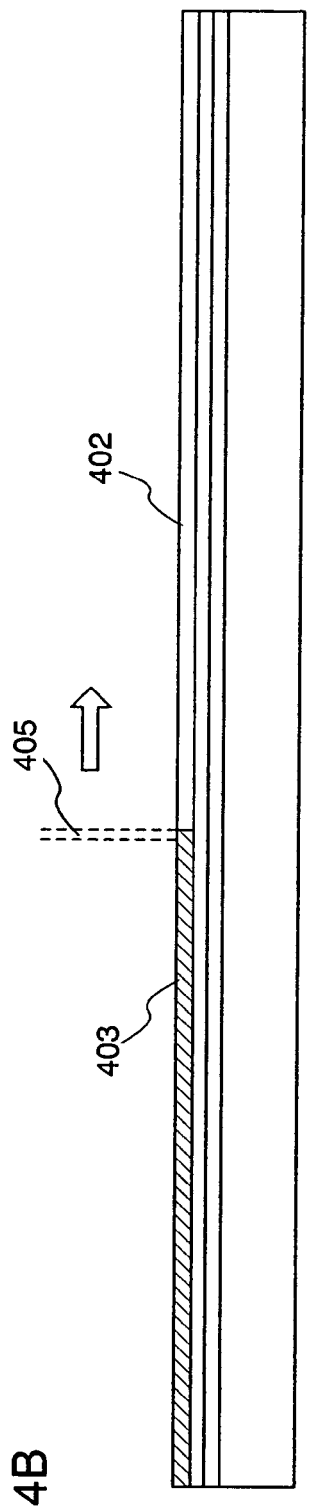

Next, as shown in FIG. 4B, the amorphous semiconductor film 402 is crystallized by irradiating laser light 405 with the use of the laser irradiation apparatus of the present invention.

In this embodiment mode, the laser light is Nd: YVO$_4$ laser light having an oscillation mode of TEM$_{00}$, a fundamental wave with an output of 200 W, and a second harmonic with an output of 10 W. It is noted that the first beam spot formed by transforming the laser light through the optical system on the surface of the amorphous semiconductor film 402 has a rectangular shape with a length of 20 μm in the minor axis and a length of 10 mm in the major axis.

And the laser light is scanned on the surface of the amorphous semiconductor film 402 in the direction indicated with an arrow in FIG. 4B. A crystal grain grown in the scanning direction continuously is formed by the irradiation of the laser light. By forming the crystal grain extending long in the scanning direction, it is possible to form a crystalline semiconductor film 403 having few crystal grain boundaries at least in the channel direction of TFT.

In addition, the laser light may be irradiated in the inert gas atmosphere such as the noble gas or nitrogen. This can suppress the roughness of the surface of the semiconductor due to the laser irradiation and suppress the variation of the threshold value due to the variation of the interface state density.

Figure 4C:
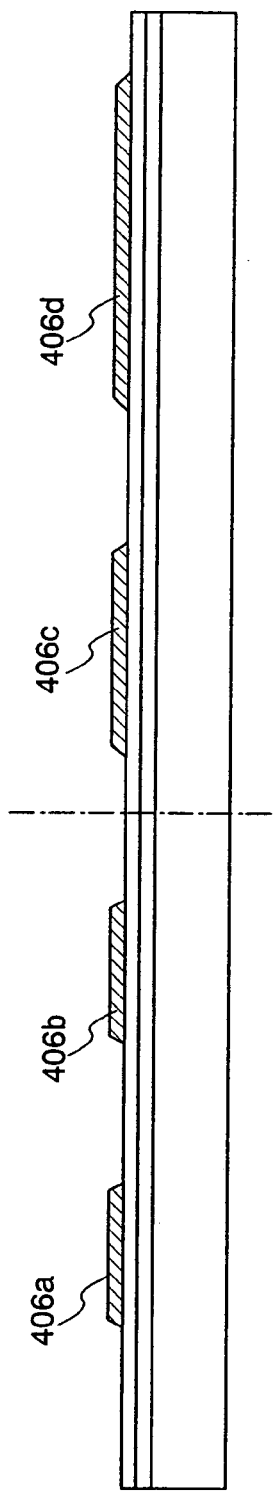

Next, as shown in FIG. 4C, the crystalline semiconductor film 403 is patterned to form island-shaped semiconductor films 406a to 406d and various kinds of semiconductor elements typified by TFT are formed using the island-shaped semiconductor films 406a to 406d.

Next, a gate insulating film (not shown in the figure) is formed so as to cover the island-shaped semiconductor films 406a to 406d. Silicon oxide, silicon nitride, silicon nitride oxide, or the like can be used as the gate insulating film for example. In addition, the plasma-CVD, the sputtering, or the like can be employed as the film-forming method.

Next, a gate electrode is formed by forming a conductive film on the gate insulating film and by patterning it. And, a source region, a drain region, an LDD region, and the like are formed by adding the impurity imparting n-type or p-type conductivity to the island-shaped semiconductor films 406a to 406d using the gate electrode or the resist to be formed and patterned as a mask.

TFT can be thus formed according to the above steps. It is noted that the method for manufacturing a semiconductor device of the present invention is not limited to the manufacturing process of the TFT described above. In the present invention, the crystalline semiconductor film formed using the laser irradiation method is used as the active layer of TFT. As a result, it is possible to suppress the variation of the mobility, the threshold value, and the on-current between the elements.

It is noted that the condition for the laser irradiation is not limited to that shown in the present embodiment mode.

In addition, before the crystallization by the laser light, a crystallization step with the use of catalyst element may be provided. It is noted that although nickel (Ni) is used as the catalyst element in this embodiment mode, the other element such as germanium (Ge), iron (Fe), palladium (Pd), tin (Sn), lead (Pb), cobalt (Co), platinum (Pt), copper (Cu), or gold (Au) may be also used. When the crystallizing process by the laser light is performed after the crystallizing process using the catalyst element, the crystal formed in the crystallization by the catalyst element remains without being melted by the irradiation of the laser light, and the crystallization is promoted by having the crystal as its crystal nucleus. Compared to the case in which the semiconductor film is crystallized only by the laser light, the crystallinity of the semiconductor film can be further enhanced and the roughness of the surface of the semiconductor film after the crystallization by the laser light can be suppressed. Therefore, the variation of the characteristics of the semiconductor element to be formed afterward typified by TFT can be more suppressed and the off-current can be also suppressed.

It is noted that the crystallization may be performed in such a way that after the catalyst element is added, the heating process is performed so as to promote the crystallization and then the laser light is irradiated so as to enhance the crystallinity further. Alternatively, the heating process may be omitted. Specifically, after adding the catalyst element, the laser light may be irradiated to the semiconductor film instead of the heating process so as to enhance the crystallinity.

Although this embodiment mode showed the example in which the laser irradiation method of the present invention is applied to crystallize the semiconductor film, the laser irradiation method of the present invention can be also applied to activate the impurity element doped in the semiconductor film.

The method for manufacturing a semiconductor device of the present invention can be applied to manufacture an integrated circuit and a semiconductor display device. Particularly, the present invention can be applied to the semiconductor element such as the transistor provided in the pixel portion of the semiconductor display device such as a liquid crystal display device, a light-emitting device having a light-emitting element, typically an organic light-emitting element, equipped in each pixel, a DMD (Digital Micromirror Device), a PDP (Plasma Display Panel), or an FED (Field Emission Display).

[Embodiment Mode 5]

The present embodiment mode explains a light-emitting device manufactured using the laser irradiation method.

Figure 5A:
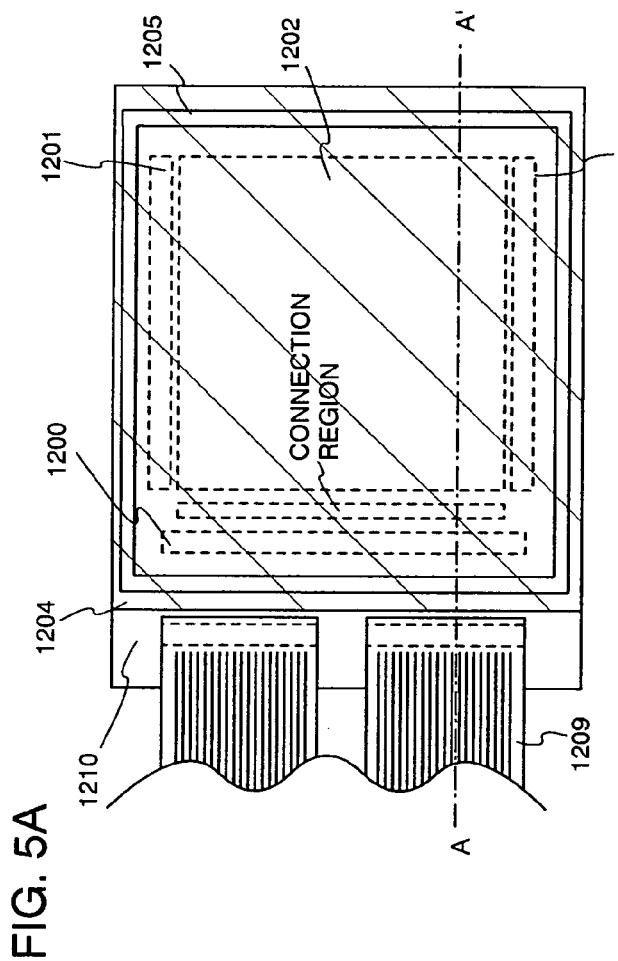
FIGS. 5A and 5B are drawings which illustrate a light-emitting device manufactured by performing the laser irradiation according to the present invention.

FIG. 5A shows a light-emitting device having a signal line driver circuit 1200, a scanning line driver circuit 1201, and a pixel portion 1202 all of which are formed on a first substrate 1210.

Figure 5B:
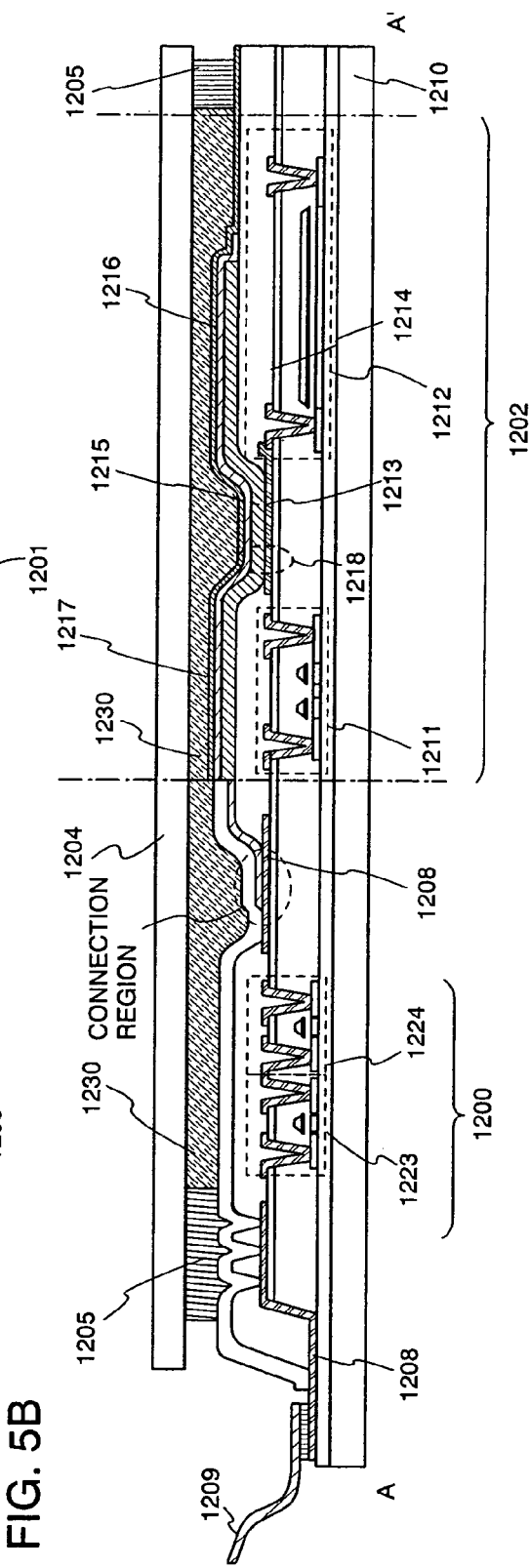

FIG. 5B is a cross-sectional view of a display device taken along A–A', which illustrates the signal line driver circuit 1200 equipped with a CMOS circuit having an n-channel TFT 1223 and a p-channel TFT 1224 on the first substrate 1210. The n-channel TFT 1223 and the p-channel TFT 1224 are formed of a crystalline semiconductor film of high quality obtained by performing the laser annealing in such a way that the laser light having the fundamental wave and the laser light having a wavelength not longer than that of the visible light are combined. TFT forming the signal line driver circuit 1200 and the scanning line driver circuit 1201 may be also formed of the CMOS circuit, a PMOS circuit, or an NMOS circuit.

The pixel portion 1202 has a switching TFT 1211 and a driver TFT 1212. The switching TFT 1211 and the driver TFT 1212 are formed using the crystalline semiconductor film of high quality obtained by performing the laser annealing in such a way that the laser light having the fundamental wave and the laser light having a wavelength not longer than that of the visible light are combined. It is noted that TFT in the pixel portion 1202 does not need to have high crystallinity compared with the signal line driver circuit 1200 and the scanning line driver circuit 1201. In addition, the pixel portion 1202 has an insulator 1214 which covers a portion of the first electrode 1213 of the light-emitting element connected to one electrode of the driver TFT 1212. And the insulator 1214 covers the switching TFT 1211 and the driver TFT 1212. And the insulator 1214 has an opening in the position corresponding to the first electrode 1213 of the light-emitting element. The pixel portion 1202 also has a light-emitting element 1218 in which the electro-luminescent layer 1215 is provided on the first electrode 1213 and the second electrode 1216 of the light-emitting layer is further provided on the electro-luminescent layer 1215. It is noted that the electroluminescent layer is formed of an organic material or an inorganic material, and it is constituted by combining an electron injecting layer, an electron transporting layer, a light emitting layer, a hole transporting layer, a hole injecting layer, and the like appropriately.

The insulator 1214 may be formed of an organic resin film such as resist, polyimide, or acryl, or may be formed of an inorganic insulating film including silicon such as silicon nitride or silicon oxide. Here, the insulator 1214 is formed of a positive photosensitive acryl resin film. It is noted that when the organic resin film or the like is used, in order to prevent the moisture or the oxygen from penetrating thereinto, it is preferable to form an insulating film including silicon nitride or silicon nitride oxide as its main component or to form a DLC (Diamond Like Carbon) film including hydrogen.

It is noted that in order to improve the coverage to the step of the electrode or the electroluminescent layer to be formed afterward, it is preferable to form the insulator 1214 so as to have radius of curvature in its upper part or in its lower part. For example, when the insulator 1214 is formed of the positive photosensitive acrylic, it is preferable that only the upper part of the insulator 1214 has radius of curvature (in the range of 0.2 to 3 μm). In addition, either a negative type which becomes insoluble in etchant by the irradiation of the light or a positive type which becomes soluble in etchant by the irradiation of the light can be applied as the insulator 1214.

Since the first electrode 1213 of the light-emitting element contacts the first electrode of the driver TFT 1212, it is desirable that at least the bottom surface of the first electrode 1213 of the light-emitting element is formed of the material having an ohmic contact with the first electrode region of the semiconductor film and that the surface thereof contacting the electroluminescent layer is formed of the material which has high work function. For example, the first electrode 1213 of the light-emitting element may be formed of a single layer of a titanium nitride film or may be formed by laminating three or more layers. Furthermore, when the first electrode 1213 and the second electrode 1216 of the light-emitting element are formed of a conductive film having translucency, it is possible to manufacture a display device having a light-emitting element of dual emission type.

Both the first electrode and the second electrode can be the anode or the cathode according to the pixel structure. For example, when the first electrode is the anode and the second electrode is the cathode, the specific material for the electrode is explained as follows.

It is desirable to use metal, alloy, conductive compound, and a mixture of these having high work function (work function is 4.0 eV or more) as the anode material. More specifically, ITO (indium tin oxide), IZO (indium zinc oxide) including indium oxide which is mixed with tin oxide (ZnO) in the range of 2 to 20%, gold (Au), platinum (Pt), nickel (Ni), tungsten (W), chromium (Cr), molybdenum (Mo), iron (Fe), cobalt (Co), copper (Cu), palladium (Pd), or the metallic nitride material such as TiN can be used as the anode material.

On the other hand, it is desirable to use metal, alloy, conductive compound, or a mixture of these having low work function (work function is 3.8 eV or less) as the cathode material. Specifically, the cathode can be formed of the material such as the element belonging to the first group or the second group in the periodic table, that is to say, alkali metal such as Li or Cs; alkaline-earth metal such as Ca or Sr; Mg; alloy including these such as Mg:Ag or Al:Li; a chemical compound such as LiF, CsF, or $CaF_2$; or transition metal including rare-earth metal. However, since the cathode needs to have translucency, the cathode is formed by forming these metals or the alloy including these metals extremely thinly and by laminating the metal (including alloy) such as ITO. These anode and cathode can be formed by the vapor deposition method, the sputtering method, or the like.

In addition, when the full-color display is performed, the electroluminescent layer 1215 is formed in such a way that the materials each showing the red (R), the green (G), and the blue (B) color emission are formed selectively by the vapor deposition method with the use of the respective deposition masks or by an ink-jetting method. Specifically, CuPc or PEDOT is employed as HIL, α-NPD is employed as HTL, BCP or $Alq_3$ is employed as ETL, BCP:Li or $CaF_2$ is employed as EIL respectively. In addition, $Alq_3$ doped with dopant in accordance with the respective colors of R, G, and B (DCM or the like in the case of R, DMQD or the like in the case of G) may be employed as EML. It is noted that the structure is not limited to the laminated structure of the organic compound layer described above.

More specific laminated structure of the organic compound layer is explained as follows. In the case of forming the organic compound layer showing red color emission, for example CuPc is formed 30 nm in thickness and then α-NPD is formed 60 nm in thickness. After that, the same mask is used to form $Alq_3$ with $DCM_2$ and rubrene added 40 nm in thickness as a red light-emitting layer, to form BCP 40 nm in thickness as an electron transporting layer, and to form BCP with Li added 1 nm in thickness as an electron injecting layer. In addition, in the case of forming the organic compound layer showing green color emission, for example CuPc is formed 30 nm in thickness and then α-NPD is formed 60 nm in thickness. After that, the same vapor deposition mask is used to form $Alq_3$ with coumarin 545T added 40 nm in thickness as the green light-emitting layer, to form BCP 40 nm in thickness as the electron transporting layer, and to form BCP with Li added 1 nm in thickness as the electron injecting layer. Moreover, in the case of forming the organic compound layer showing blue color emission, for example CuPc is formed 30 nm in thickness and then α-NPD is formed 60 nm in thickness. After that, the same mask is used to form bis [2-(2-hydroxyphenyl) benzoxazolate] zinc: $Zn(PBO)_2$ in 10 nm thick as a light-emitting layer. Then, BCP is formed in 40 nm thick as the electron transporting layer and BCP with Li added is formed in 1 nm thick as the electron injecting layer.

Among the organic compound layers of these colors, CuPc and α-NPD, which are common to all the layers, can be formed all over the pixel portion. In addition, the mask can be shared among these colors. For example, after forming the red organic compound layer, the mask is moved to form the green organic compound layer. Then the mask is moved again to form the blue organic compound layer. In addition, the order of the organic compound layer of each color to be formed may be set appropriately.

In addition, in the case of white light emission, a full color display may be performed by providing a color filter or a color conversion layer separately. The color filter or the color conversion layer may be pasted after providing it to the second substrate.

In order to prevent the light-emitting element from deteriorating due to the moisture, the oxygen, or the like, there is a protective film 1217 provided so as to cover the second electrode of the light-emitting element. In this embodiment mode, the protective film 1217 is formed of the insulating film including silicon nitride or silicon nitride oxide as its main component or formed of a DLC (Diamond Like Carbon) film including hydrogen.

And the second electrode 1216 of the light-emitting element is connected to a connection wiring 1208 through a lead wiring from an opening (contact) provided at the connection region in the insulator 1214. The connection wiring 1208 is connected to a flexible print substrate (FPC)

1209 by anisotropic conductive resin (AFC). And a video signal or a clock signal to become an external input signal is received through the FPC 1209. Although only the FPC is illustrated here, a print wiring board (PWB) may be provided in this FPC.

The present embodiment mode shows the light-emitting device with the driver integrally formed in which the signal line driver circuit 1200 and the scanning line driver circuit 1201 are formed on the first substrate 1210. However, the signal line driver circuit and the scanning line driver circuit may be formed by IC and they may be connected to a signal line or a scanning line by a SOG method or a TAB method.

In addition, when ACF is pasted by pressurizing or heating, attention should be paid so that crack is not generated due to the flexibility of the substrate or the softening by the heating. For example, the substrate having high rigidity may be set as a support in the region to be pasted.

In addition, a sealant 1205 is provided in the periphery of the first substrate and then the first substrate is pasted with the second substrate 1204, and then they are sealed. It is preferable to use epoxy resin as the sealant 1205.

When they are sealed, there is formed a space between the second substrate 1204 and the protective film 1217. The space is filled with the inert gas such as nitrogen gas or with the material having high moisture-absorption characteristic so that moisture or oxygen may not intrude into the space. In the present embodiment mode, a resin 1230 having translucency and having high moisture-absorption characteristic is formed in this space. Since the resin 1230 is translucent, transmittance does not decrease even when the light from the light-emitting element is emitted to the second substrate.

As above, a sophisticated thin film transistor and a light-emitting device having it can be manufactured in the high-throughput process at low cost.

[Embodiment Mode 6]

The present embodiment mode explains a liquid crystal display device manufactured using the laser irradiation method.

FIG. 6A shows the liquid crystal display device in which the signal line driver circuit 1200, the scanning line driver circuit 1201, and the pixel portion 1202 are formed on the first substrate 1210.

FIG. 6B is a cross-sectional view of the display device taken along A–A', which illustrates the signal line driver circuit 1200 equipped with a CMOS circuit having an n-channel TFT 1223 and a p-channel TFT 1224 on the first substrate 1210. The n-channel TFT 1223 and the p-channel TFT 1224 are formed using the crystalline semiconductor film of high quality obtained by performing the laser annealing in such a way that the laser light having the fundamental wave and the laser light having a wavelength not longer than that of the visible light are combined. TFT forming the signal line driver circuit 1200 and the scanning line driver circuit 1201 may be formed of the CMOS circuit, a PMOS circuit, or an NMOS circuit.

The pixel portion 1202 has a switching TFT 1211 and a capacitance element 1245. The switching TFT 1211 is formed using the crystalline semiconductor film obtained by performing the laser annealing in such a way that the laser light having the fundamental wave and the laser light having a wavelength not longer than that of the visible light are combined. The capacitance element 1245 is constituted by the gate insulating film sandwiched between the semiconductor film with the impurity added and the gate electrode.

It is noted that TFT of the pixel portion 1202 does not need to have high crystallinity compared to the signal line driver circuit 1200 and the scanning line driver circuit 1201. The signal line driver circuit 1200 has the n-channel TFT 1223, the p-channel TFT 1224. The pixel portion 1202 has an insulator 1214, and a pixel electrode 1250. The insulator 1214 covers portion of the pixel electrode 1250 connected to one electrode of the switching TFT 1211.

In the second substrate 1204 to become an opposing substrate, a black matrix 1253 is provided in the position corresponding to the signal line driver circuit 1200, and a color filter 1252 is provided at least in the position corresponding to the pixel portion. The rubbing treatment is performed to the second substrate 1204 with the opposing electrode 1251 formed, and the first substrate 1210 and the second substrate 1204 are pasted with a spacer 1255 interposed therebetween.

A liquid crystal layer is injected between the first substrate 1210 and the second substrate 1204. It is preferable to inject the liquid crystal layer in the vacuum atmosphere. Alternatively, the liquid crystal layer may be delivered by drops into the first substrate 1210 and then the first substrate 1210 may be pasted with the second substrate 1204. In particular, in the case of using the large substrate, delivering the liquid crystal layer by drops is more preferable than injecting it.

The first substrate 1210 and the second substrate 1204 are pasted with the use of the sealant 1205. It is preferable to provide a polarizer in the first substrate 1210 and the second substrate 1204 appropriately so as to enhance the contrast.

As above, a sophisticated thin film transistor and a liquid crystal display device having it can be manufactured in the high-throughput process at low cost.

[Embodiment Mode 7]

As the examples of the electronic instruments manufactured by applying the present invention, there are a digital camera, a sound playback device such as a car audio, a note-type personal computer, a game machine, a personal digital assistant (a mobile phone, a mobile game machine, or the like), an image reproduction device equipped with a recording medium such as a home-use game machine, and the like. FIGS. 7A to 7H illustrate the specific examples of these electronic instruments.

Figure 7A:
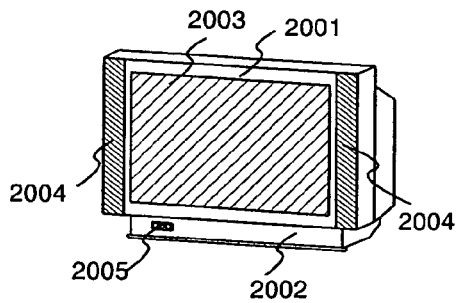
FIGS. 7A to 7H are drawings which illustrate the electronic instruments manufactured by performing the laser irradiation according to the present invention.

FIG. 7A shows a display device including a chassis 2001, a supporting stand 2002, a display portion 2003, a speaker portion 2004, a video input terminal 2005, and the like. The display portion 2003 has a light-emitting element or a liquid crystal element. A thin film transistor formed by the laser irradiation according to the present invention can be used as the display portion 2003. Furthermore, since it is possible to manufacture in the high-throughput process at low cost, the cost for manufacturing the display device can be reduced.

Figure 7B:
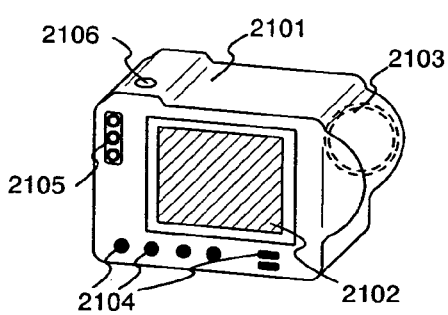

FIG. 7B shows a digital still camera including a main body 2101, a display portion 2102, an image receiving portion 2103, an operation key 2104, an external connection port 2105, a shutter 2106, and the like. The display portion 2102 has a light-emitting element or a liquid crystal element. A thin film transistor formed by the laser irradiation according to the present invention can be used as the display portion 2102. Furthermore, since it is possible to manufacture in the high-throughput process at low cost, the cost for manufacturing the digital still camera can be reduced.

Figure 7C:
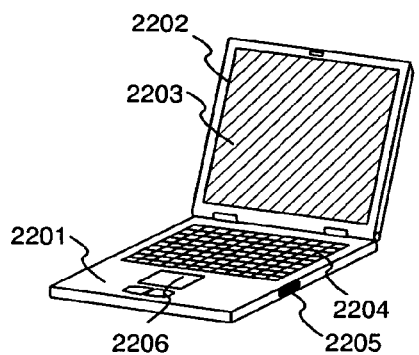

FIG. 7C shows a note-type personal computer including a main body 2201, a chassis 2202, a display portion 2203, a keyboard 2204, an external connection port 2205, a pointing mouse 2206, and the like. The display portion 2203 has a light-emitting element or a liquid crystal element. A thin film transistor formed by the laser irradiation according to the present invention can be used as the display portion 2203. Furthermore, since it is possible to manufacture in the high-throughput process at low cost, the cost for manufacturing the note-type personal computer can be reduced.

Figure 7D:
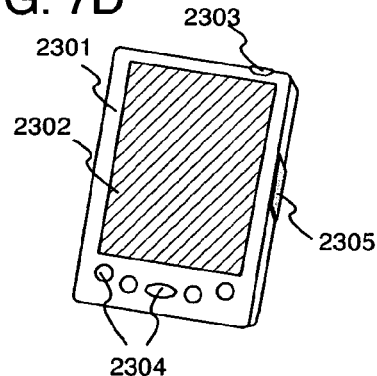

FIG. 7D shows a mobile computer including a main body 2301, a display portion 2302, a switch 2303, an operation key 2304, an infrared port 2305, and the like. The display portion 2302 has a light-emitting element or a liquid crystal element. The thin film transistor formed by the laser irradiation according to the present invention can be used as the display portion 2302. Furthermore, since it is possible to manufacture in the high-throughput process of at low cost, the cost for manufacturing the mobile computer can be reduced.

Figure 7E:
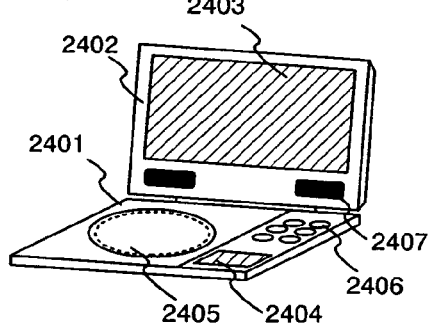

FIG. 7E shows a mobile image reproduction device with a recording medium equipped including a main body 2401, a chassis 2402, a display portion A2403, a display portion B2404, a recording medium reader 2405, an operation key 2406, a speaker portion 2407, and the like. The display portion A2403 mainly displays the image information, while the display portion B2404 mainly displays textual information. The display portion A2403 and the display portion B2404 have the light-emitting element or the liquid crystal element. The thin film transistor formed by the laser irradiation according to the present invention can be used as the display portion A2403 and the display portion B2404. Furthermore, since it is possible to manufacture in the high-throughput process at low cost, the cost for manufacturing the image reproduction device can be reduced.

Figure 7F:
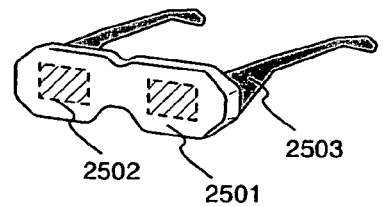

FIG. 7F shows a goggle type display including a main body 2501, a display portion 2502, and an arm portion 2503. The display portion 2502 has the light-emitting element or the liquid crystal element. The thin film transistor formed by the laser irradiation according to the present invention can be used as the display portion 2502. Furthermore, since it is possible to manufacture in the high-throughput process at low cost, the cost for manufacturing the goggle type display can be reduced.

Figure 7G:
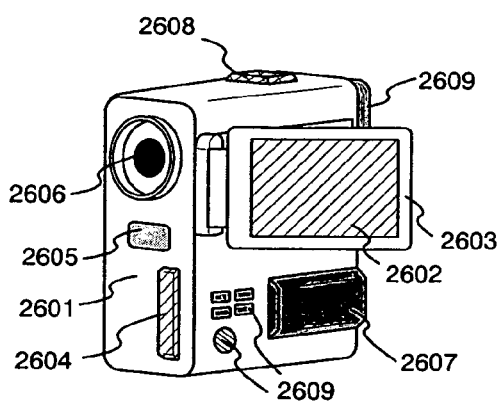

FIG. 7G shows a video camera including a main body 2601, a display portion 2602, a chassis 2603, an external connection port 2604, a remote control receiver 2605, an image receiver 2606, a battery 2607, an audio input portion 2608, an operation key 2609, and the like. The display portion 2602 has the light-emitting element or the liquid crystal element. The thin film transistor formed by the laser irradiation according to the present invention can be used as the display portion 2602. Furthermore, since it is possible to manufacture in the high-throughput process at low cost, the cost for manufacturing the video camera can be reduced.

Figure 7H:
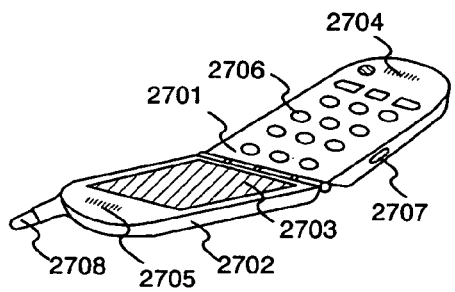

FIG. 7H shows a mobile phone, one of personal digital assistants, including a main body 2701, a chassis 2702, a display portion 2703, an audio input portion 2704, an audio output portion 2705, an operation key 2706, an external connection port 2707, an antenna 2708, and the like. The display portion 2703 has the light-emitting element or the liquid crystal element. The thin film transistor formed by the laser irradiation according to the present invention can be used as the display portion 2703. Furthermore, since it is possible to manufacture in the high-throughput process at low cost, the cost for manufacturing the mobile phone can be reduced.

It is possible to provide the sophisticated thin film transistor and the electronic instrument having it in the high-throughput process at low cost by performing the laser irradiation according to the present invention.

The present embodiment mode can be combined with any one of the above embodiment modes freely.

[Advantageous Effect of the Invention]

The laser irradiation apparatus of the present invention needs only one resonator because the laser light is irradiated without separating the fundamental wave and the harmonic from one resonator. Therefore, the cost for running the resonator can be lowered. Moreover, since it is unnecessary to oscillate the laser light having the fundamental wave and the laser light having the harmonic from the respective resonators and to combine them on the irradiated object, it is easy to adjust the optical system. Furthermore, since the fundamental wave and the harmonic are shaped into linear through the same optical system, the optical system can be simplified.

In the present invention, it is possible to perform the laser irradiation efficiently and to enlarge the region to be annealed, which is the region having superior crystallinity, by irradiating the laser light without separating the harmonic having low energy and the fundamental wave. Therefore, the throughput is expected to increase.

This makes it possible to manufacture a sophisticated thin film transistor and a semiconductor device having it in the high-throughput process at low cost.

What is claimed is:

1. A laser irradiation method comprising:
emitting a laser light from a laser resonator, the laser light having a fundamental wave and having a wavelength not longer than that of the fundamental wave converted from the fundamental wave by a nonlinear optical element,
wherein the laser light having the fundamental wave and having the wavelength not longer than that of the fundamental wave is irradiated simultaneously to a same irradiation surface without being separated, and
wherein the laser light emitted from the laser resonator is a continuous wave laser light.

2. A laser irradiation method according to claim 1, wherein the wavelength not longer than that of the fundamental wave is a harmonic converted from the fundamental wave by the nonlinear optical element.

3. A laser irradiation method according to claim 1, wherein the wavelength not longer than that of the fundamental wave is a second harmonic converted from the fundamental wave by the nonlinear optical element.

4. A laser irradiation method according to claim 1, wherein the laser light has an incidence angle $\phi$ satisfying an inequality $\phi \geq \arctan(W/2d)$, when it is assumed that the laser light is shaped into linear, that a major axis or a minor axis of the linear laser light on a surface of a processing object is W, and that a substrate on which the irradiation surface is provided and which has translucency to the linear laser light has a thickness of d.

5. A laser irradiation method according to claim 1, wherein the laser resonator comprises a solid selected from the group consisting of YAG, YLF, $YVO_4$, $Y_2O_3$, glass, sapphire, forsterite, LuAg, and $LuLiF_4$, each of which is doped with an ion selected from the group consisting of Nd, Yb, Ti, Cr, Ho, or Er as a laser medium.

6. A laser irradiation method comprising:
emitting a laser light from a laser resonator, the laser light having a fundamental wave and having a wavelength not longer than that of the fundamental wave,
wherein the laser resonator has a nonlinear optical element, wherein the laser light having the fundamental wave and having the wavelength not longer than that of the fundamental wave is irradiated simultaneously to a same irradiation surface without being separated, and wherein the laser light emitted from the laser resonator is a continuous wave laser light.

7. A laser irradiation method according to claim 6, wherein the wavelength not longer than that of the fundamental wave is a harmonic converted from the fundamental wave by the nonlinear optical element.

8. A laser irradiation method according to claim 6, wherein the wavelength not longer than that of the fundamental wave is a second harmonic converted from the fundamental wave by the nonlinear optical element.

9. A laser irradiation method according to claim 6, wherein the laser light has an incidence angle $\phi$ satisfying an inequality of $\phi \geq \arctan(W/2d)$, when it is assumed that the laser light is shaped into linear, that a major axis or a minor axis of the linear laser light on a surface of a processing object is W, and that a substrate on which the irradiation surface is provided and which has translucency to the linear laser light has a thickness of d.

10. A laser irradiation method according to claim 6, wherein the laser resonator comprises a solid selected from the group consisting of YAG, YLF, YVO$_4$, Y$_2$O$_3$, glass, sapphire, forsterite, LuAg, and LuLiF$_4$, each of which is doped with an ion selected from the group consisting of Nd, Yb, Ti, Cr, Ho, or Er as a laser medium.

11. A method for manufacturing a semiconductor device comprising:

forming an amorphous semiconductor film over a substrate;

irradiating the amorphous semiconductor film with a laser light emitted from a laser resonator, the laser light having a fundamental wave and having a wavelength not longer than that of the fundamental wave converted from the fundamental wave by a nonlinear optical element, wherein the laser light having the fundamental wave and having the wavelength not longer than that of the fundamental wave is irradiated simultaneously to a same irradiation surface without being separated, and wherein the laser light emitted from the laser resonator is a continuous wave laser light.

12. A method for manufacturing a semiconductor device according to claim 11, wherein the wavelength not longer than that of the fundamental wave is a harmonic converted from the fundamental wave by the nonlinear optical element.

13. A method for manufacturing a semiconductor device according to claim 11, wherein the wavelength not longer than that of the fundamental wave is a second harmonic converted from the fundamental wave by the nonlinear optical element.

14. A method for manufacturing a semiconductor device according to claim 11, wherein the laser resonator comprises a solid selected from the group consisting of YAG, YLF, YVO$_4$, Y$_2$O$_3$, glass, sapphire, forsterite, LuAg, and LuLiF$_4$, each of which is doped with an ion selected from the group consisting of Nd, Yb, Ti, Cr, Ho, or Er as a laser medium.

15. A method for manufacturing a semiconductor device according to claim 11, wherein the semiconductor device is at least one selected from the group consisting of a display device, a digital camera, a personal computer, a mobile computer, an image reproduction device, a goggle-type display, a video camera, and a mobile phone.

16. A method for manufacturing a semiconductor device comprising:

forming an amorphous semiconductor film over a substrate;

irradiating the amorphous semiconductor film with a laser light emitted from a laser resonator including a nonlinear optical element, the laser light having a fundamental wave and having a wavelength, not longer than that of the fundamental wave, wherein the laser light having the fundamental wave and having the wavelength not longer than that of the fundamental wave is irradiated simultaneously to a same irradiation surface without being separated, and wherein the laser light emitted from the laser resonator is a continuous wave laser light.

17. A method for manufacturing a semiconductor device according to claim 16, wherein the wavelength not longer than that of the fundamental wave is a harmonic converted from the fundamental wave by the nonlinear optical element.

18. A method for manufacturing a semiconductor device according to claim 16, wherein the wavelength not longer than that of the fundamental wave is a second harmonic converted from the fundamental wave by the nonlinear optical element.

19. A method for manufacturing a semiconductor device according to claim 16, wherein the laser resonator comprises a solid selected from the group consisting of YAG, YLF, YVO$_4$, Y$_2$O$_3$, glass, sapphire, forsterite, LuAg, and LuLiF$_4$, each of which is doped with an ion selected from the group consisting of Nd, Yb, Ti, Cr, Ho, or Er as a laser medium.

20. A method for manufacturing a semiconductor device according to claim 16, wherein the semiconductor device is at least one selected from the group consisting of a display device, a digital camera, a personal computer, a mobile computer, an image reproduction device, a goggle-type display, a video camera, and a mobile phone.

21. A method for manufacturing a semiconductor device comprising:

forming an amorphous semiconductor film over a substrate;

irradiating the amorphous semiconductor film with a laser light emitted from a laser resonator to crystallize the amorphous semiconductor film, the laser light having a fundamental wave and having a wavelength not longer than that of the fundamental wave converted from the fundamental wave by a nonlinear optical element, wherein the laser light having the fundamental wave and having the wavelength not longer than that of the fundamental wave is irradiated simultaneously to a same irradiation surface without being separated, and wherein the laser light emitted from the laser resonator is a continuous wave laser light.

22. A method for manufacturing a semiconductor device according to claim 21, wherein the wavelength not longer than that of the fundamental wave is a harmonic converted from the fundamental wave by the nonlinear optical element.

23. A method for manufacturing a semiconductor device according to claim 21, wherein the wavelength not longer than that of the fundamental wave is a second harmonic converted from the fundamental wave by the nonlinear optical element.

24. A method for manufacturing a semiconductor device according to claim 21, wherein the laser resonator comprises a solid selected from the group consisting of YAG, YLF, YVO$_4$, Y$_2$O$_3$, glass, sapphire, forsterite, LuAg, and LuLiF$_4$, each of which is doped with an ion selected from the group consisting of Nd, Yb, Ti, Cr, Ho, or Er as a laser medium.

25. A method for manufacturing a semiconductor device according to claim 21, wherein the semiconductor device is at least one selected from the group consisting of a display device, a digital camera, a personal computer, a mobile computer, an image reproduction device, a goggle-type display, a video camera, and a mobile phone.

26. A method for manufacturing a semiconductor device comprising:
   forming an amorphous semiconductor film over a substrate;
   irradiating the amorphous semiconductor film with a laser light emitted from a laser resonator including a nonlinear optical element to crystallize the amorphous semiconductor film, the laser light having a fundamental wave and having a wavelength not longer than that of the fundamental wave,
   wherein the laser light having the fundamental wave and having the wavelength not longer than that of the fundamental wave is irradiated simultaneously to a same irradiation surface without being separated, and
   wherein the laser light emitted from the laser resonator is a continuous wave laser light.

27. A method for manufacturing a semiconductor device according to claim 26, wherein the wavelength not longer than that of the fundamental wave is a harmonic converted from the fundamental wave by the nonlinear optical element.

28. A method for manufacturing a semiconductor device according to claim 26, wherein the wavelength not longer than that of the fundamental wave is a second harmonic converted from the fundamental wave by the nonlinear optical element.

29. A method for manufacturing a semiconductor device according to claim 26, wherein the laser resonator comprises a solid selected from the group consisting of YAG, YLF, $YVO_4$, $Y_2O_3$, glass, sapphire, forsterite, LuAg, and $LuLiF_4$, each of which is doped with an ion selected from the group consisting of Nd, Yb, Ti, Cr, Ho, or Er as a laser medium.

30. A method for manufacturing a semiconductor device according to claim 26, wherein the semiconductor device is at least one selected from the group consisting of a display device, a digital camera, a personal computer, a mobile computer, an image reproduction device, a goggle-type display, a video camera, and a mobile phone.

* * * * *